United States Patent [19]

Beppu et al.

[11] Patent Number: 5,777,877
[45] Date of Patent: Jul. 7, 1998

[54] PROCESSING DEVICE AND METHOD FOR MAKING ARRANGEMENTS FOR PARTS USED IN PRODUCTS

[75] Inventors: Mitsuo Beppu; Mitsuru Yasue; Akihiro Nishio; Eiji Ohta, all of Kawasaki, Japan

[73] Assignee: Fujitsu Limited, Kawasaki, Japan

[21] Appl. No.: 556,853

[22] Filed: Nov. 2, 1995

[30] Foreign Application Priority Data

Dec. 13, 1994 [JP] Japan .................. 6-308489

[51] Int. Cl.$^6$ .................. G06F 19/00
[52] U.S. Cl. .................. 364/468.03; 364/468.12; 364/468.14
[58] Field of Search .................. 364/468.03, 468.09, 364/468.1, 468.12–468.14

[56] References Cited

U.S. PATENT DOCUMENTS

| | | | |
|---|---|---|---|
| 5,119,307 | 6/1992 | Blaha et al. | 364/468 |
| 5,216,612 | 6/1993 | Cornett et al. | 364/468 |
| 5,307,261 | 4/1994 | Maki et al. | 364/468 |
| 5,315,509 | 5/1994 | Natarajan | 364/468 |
| 5,339,247 | 8/1994 | Kirihara et al. | 364/468 |
| 5,418,728 | 5/1995 | Yada | 364/468 |
| 5,434,791 | 7/1995 | Koko et al. | 364/468 |

Primary Examiner—James P. Trammell
Attorney, Agent, or Firm—Armstrong, Westerman, Hattori, McLeland & Naughton

[57] ABSTRACT

A part arrangement processing device has apparatus for creating a design parts list indicating necessary parts for a product, in accordance with the results of design; apparatus for creating a production parts list indicating parts for arrangements for manufacture of the product, in accordance with the design parts list; apparatus for storing the design parts list and the production parts list; apparatus for recomposing a hierarchical relationship among parts in the production parts list; and apparatus for establishing a correspondence between part numbers in the design part list and part numbers in the production parts list subjected to recomposition, thereby facilitating part data exchange between the design section and the production section.

15 Claims, 21 Drawing Sheets

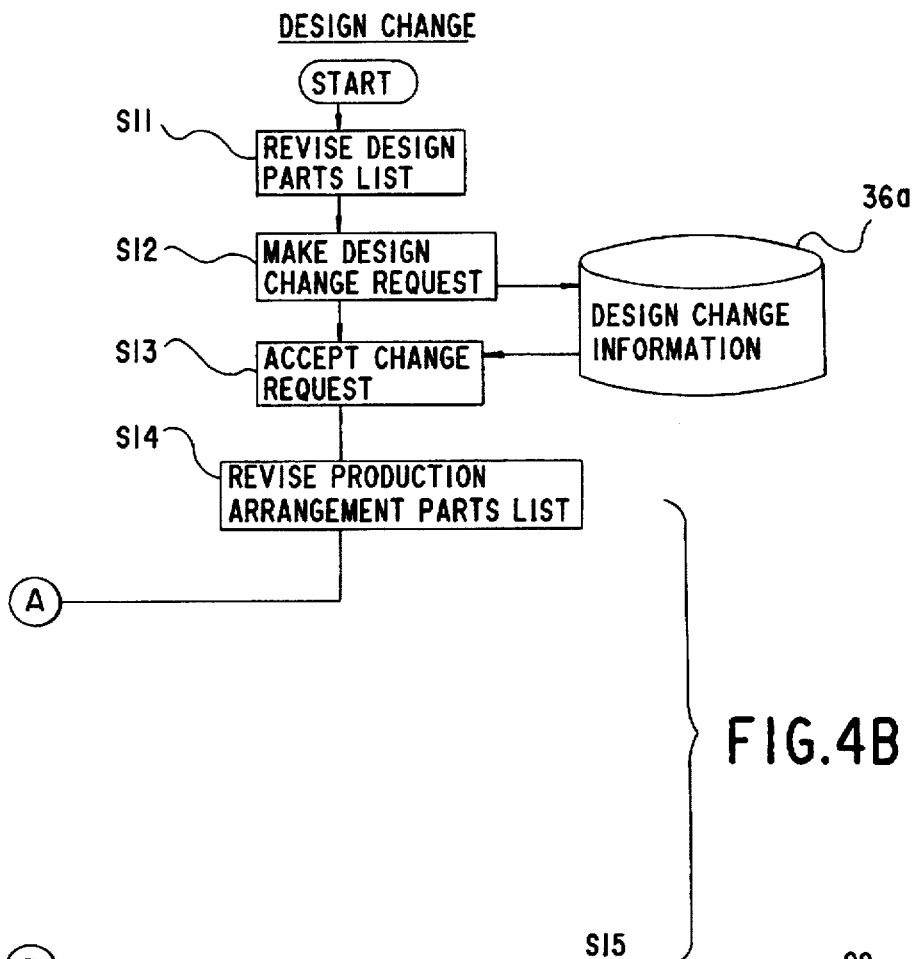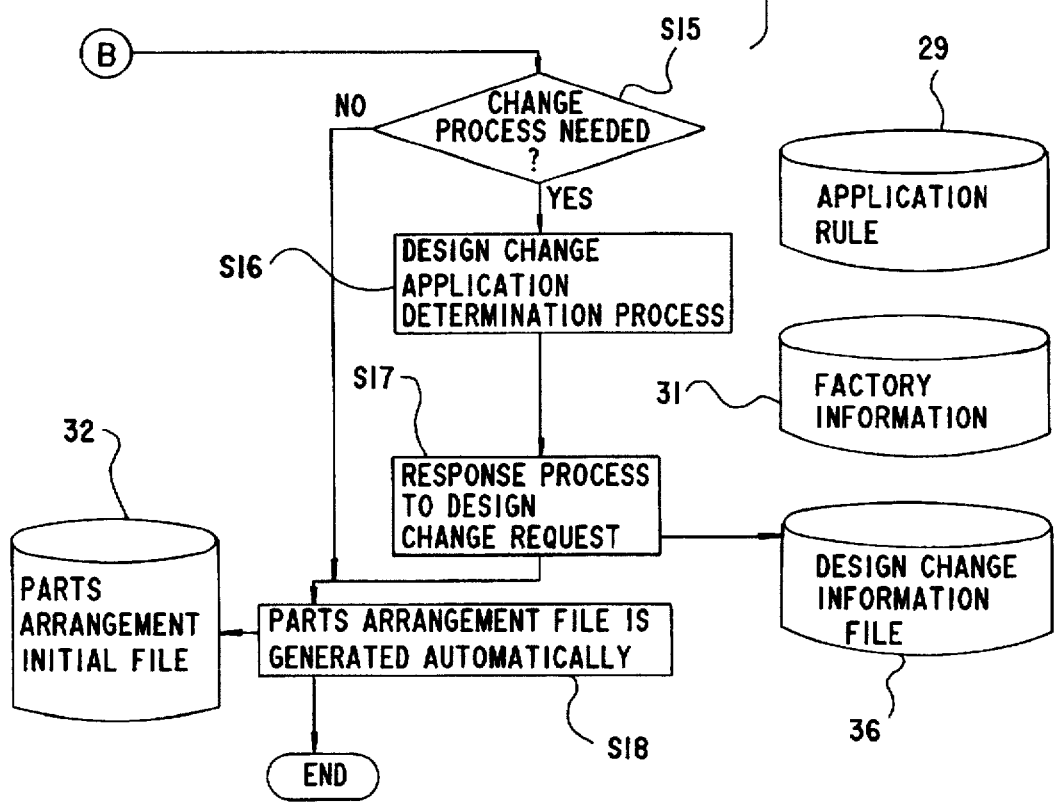
FIG.4B

| LEVEL | PART NUMBER | VERSION NUMBER | DATA OF DESIGN | ... |
|---|---|---|---|---|
| 0 | AAAA-AAAA-A005/VIEW | 0005 | 93.08.31 | |
| 1 | AAAA-AAAA-A005 | 0001 | 93.01.07 | |
| 2 | AAAA-BBBB-B012 | 0001 | 93.01.07 | |
| 3 | AAAA-CCCC-C101 | 0003 | 93.08.20 | |
| — | AAAA-CCCC-C110 | 0002 | 93.07.21 | |
| — | AAAA-AAAA-H201 | 0001 | 93.01.07 | |
| — | AAAA-AAAA-H253 | 0001 | 93.01.07 | |

FIG.7

| CODE | CONDITIONS | PROCESSING | RECOMPOSITION POSITION | RECOMPOSED |
|---|---|---|---|---|
| 0001 | PART NAME = ATTACHMENT | MERGE | PRODUCT | /0 |
| 0002 | PART NAME = BP SECTION | UP | PRODUCT | |

FIG.8

| NO. | CODE | PARENT PART NUMBER | CHILD PART NUMBER | CLASSI-FICATION |
|---|---|---|---|---|
| 1 | 0001 | AAAA-AAAA-A005 | | OLD |
| 2 | 0001 | AAAA-AAAA-A005/VIEW | AAAA-AAAA-AAAA-H201 | NEW |
| 2 | 0001 | AAAA-AAAA-A005 | AAAA-AAAA-AAAA-H253 | OLD |
| 2 | 0001 | AAAA-AAAA-A005 | AAAA-AAAA-AAAA-A005/O | OLD |
| 2 | 0001 | AAAA-AAAA-A005/VIEW | AAAA-AAAA-AAAA-H201 | NEW |
| 2 | 0001 | AAAA-AAAA-A005/O | AAAA-AAAA-AAAA-H253 | NEW |
| 3 | 0002 | AAAA-CCCC-C101 | AAAA-CCCC-C110 | OLD |
| 3 | 0002 | AAAA-AAAA-A005/VIEW | AAAA-CCCC-C110 | NEW |

| DESIGN PART NUMBER | ARRANGEMENT PART NUMBER | REMARKS |
|---|---|---|
| F6-????????? | | |
| CAA-????-???J | CAA-????-???JT | EXCLUSION OF SECONDARY MATERIAL TAPING MATERIAL |

| PARENT PART NUMBER | CHILD PART NUMBER (OLD) | CHILD PART NUMBER (NEW) |
|---|---|---|
| AAAA-AAAA-A005 | CAA-12345-678J | CAA-12345-678JT |
| AAAA-BBBB-B012 | F6-SW12345 | |
| AAAA-CCCC-C101 | CAA-56789-321J | CAA-56789-321JT |

FIG.11

| CODE | RULE | OK | NG |
|---|---|---|---|
| 0001 | [DESIGN PARTS LIST @ ARRANGEMENT PARTS] =CHANGE | 0002 | 0101 |
| 0002 | [MANUFACTURE PLAN @ ARRANGEMENT TIME] =UNARRAGED | 0003 | 0004 |
| 0003 | [DESIGN CHANGE INFORMATION] + [OLD PRODUCTION PARTS LIST] =NEW PRODUCTION PARTS LIST | 0000 | |
| 0004 | [PARTS IN STOCK @ QUANTITY] - [MANUFACTURE PLAN @ NUMBER OF PRODUCTS] * [ORIGINAL UNIT QUANTITY] =POSITIVE NUMBER | 0005 | 0006 |
| 0005 | [ARRAGEMENT FOR DELIVERY OF PARTS IN STOCK] | 0000 | |

F I G. 12

OEC APPLICATION DETERMINATION PARAMETER

| EC FACTOR | ⊚ FAILURE  ○ CUSTOMER SPECIFICATION CHANGE  ○ FUNCTIONAL IMPROVEMENT  ○ COST DOWN  ○ OTHERS |
|---|---|

| APPLICATION CONDITION | ⊚ 100% APPLICATION  ○ APPLICATION FROM ___ TERM  ○ NEXT LOT/NEXT TERM APPLICATION  ○ NON-APPLICATION |
|---|---|

| CONTENTS OF CHANGE | ⊚ PT RELATION  ○ DEVICE RELATION  ○ MECHANISM RELATION  ○ FRAM RELATIONS  ○ OTHERS |
|---|---|
| CLASSIFICATION | ⊚ PART CHANGE  ○ DISCONNECT/CONNECT  ○ BOAD  ○ OTHERS |
| FAILURE SCALE | UNIT PRICE ¥5,000 ×100units = ¥500,000 |

| STATUS | FIELD | WARE HOUSE | TESTED | UNDER TEST | UNDER MANU-FACTURE | ARRANGED | UNARRANGE-MENT | (TOTAL) |
|---|---|---|---|---|---|---|---|---|
| NUMBER OF PRODUCTS | 100 | 0 | 0 | 20 | 50 | 30 | 900 | 1000 |

( CONFIRM )  ( RETURN )          ( MANUFACTURE INFORMATION REFERENCE )  ( STOCK INFORMATION REFERENCE )  ( FIELD INFORMATION REFERENCE )

FIG. 13

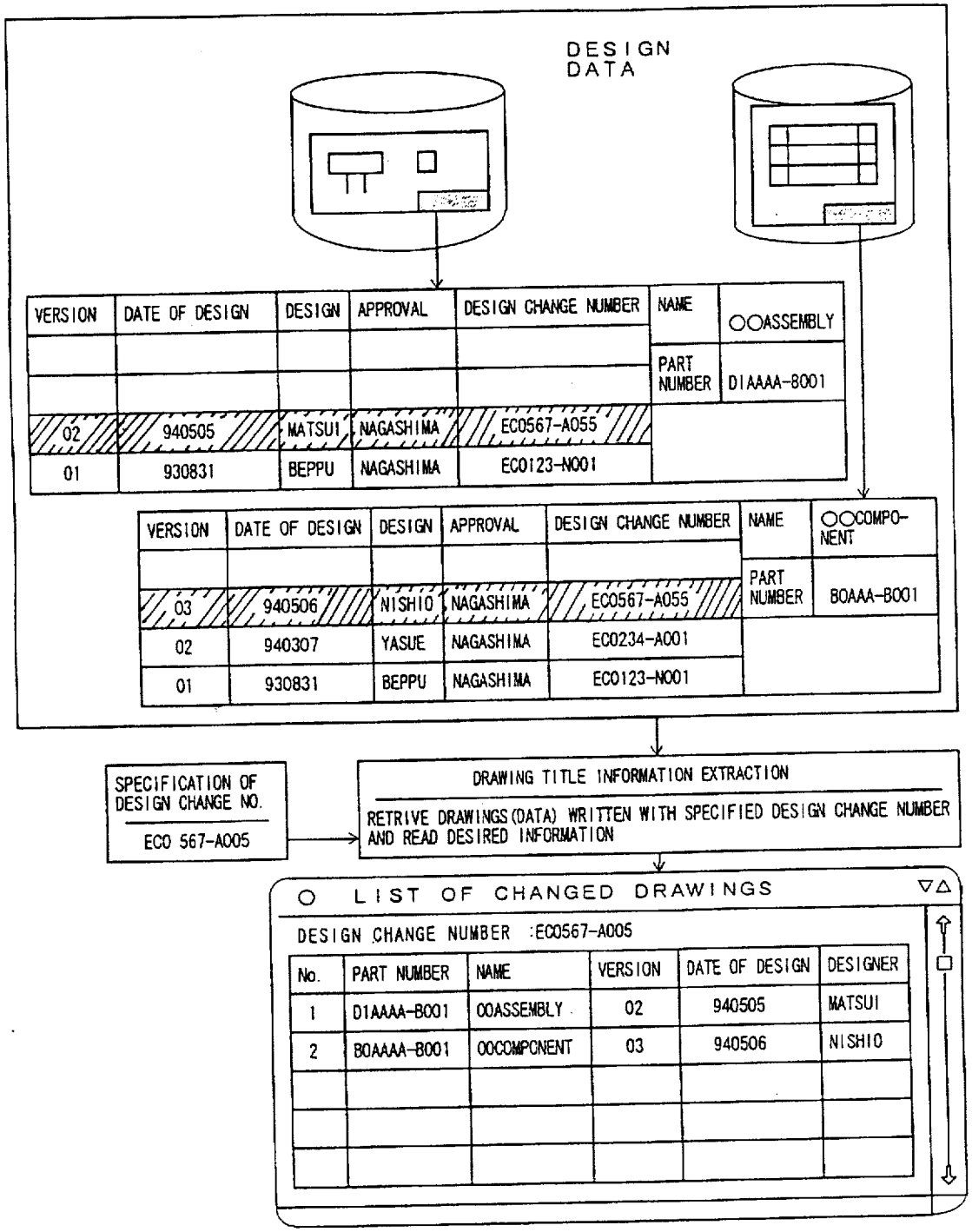
F I G. 14

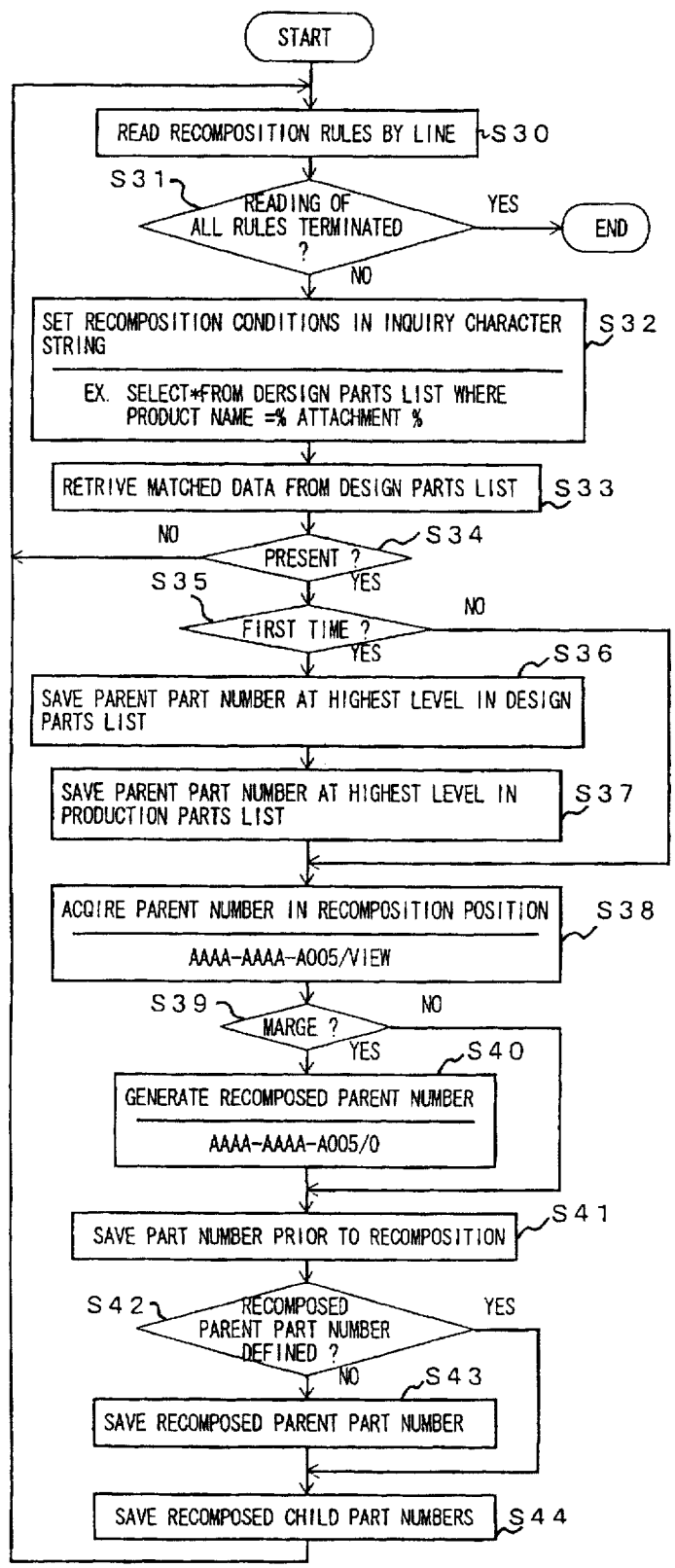
F I G. 15

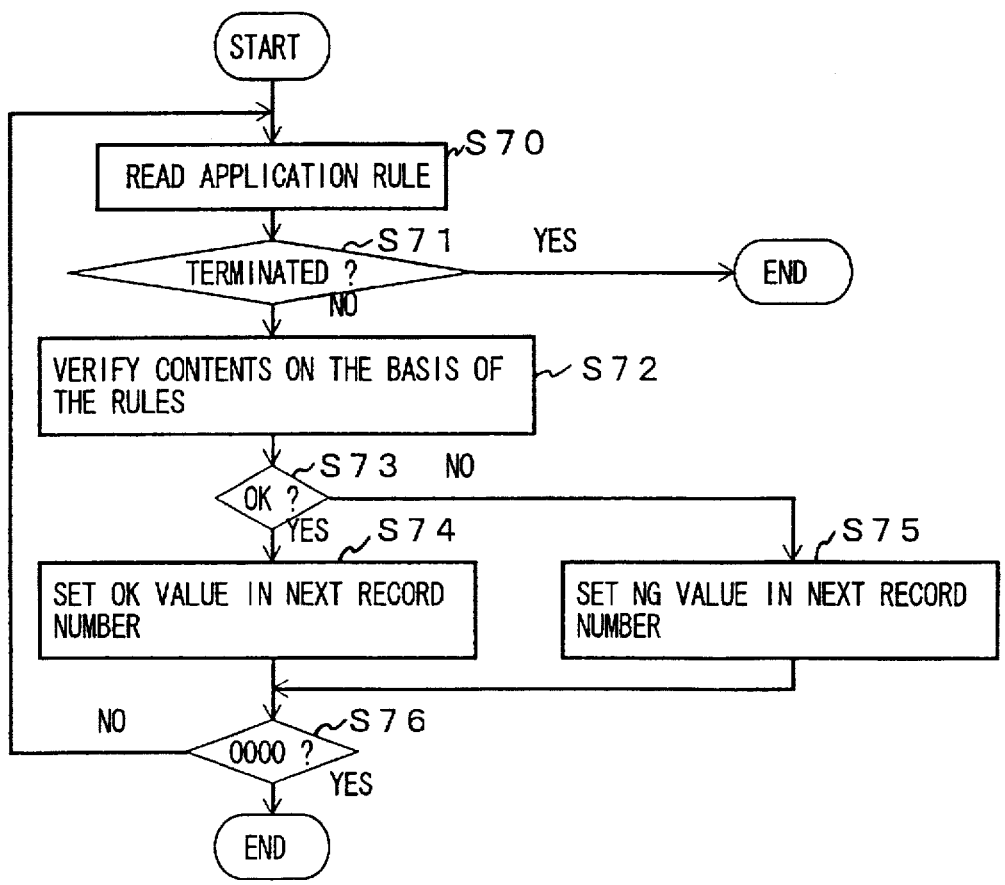
F I G. 19

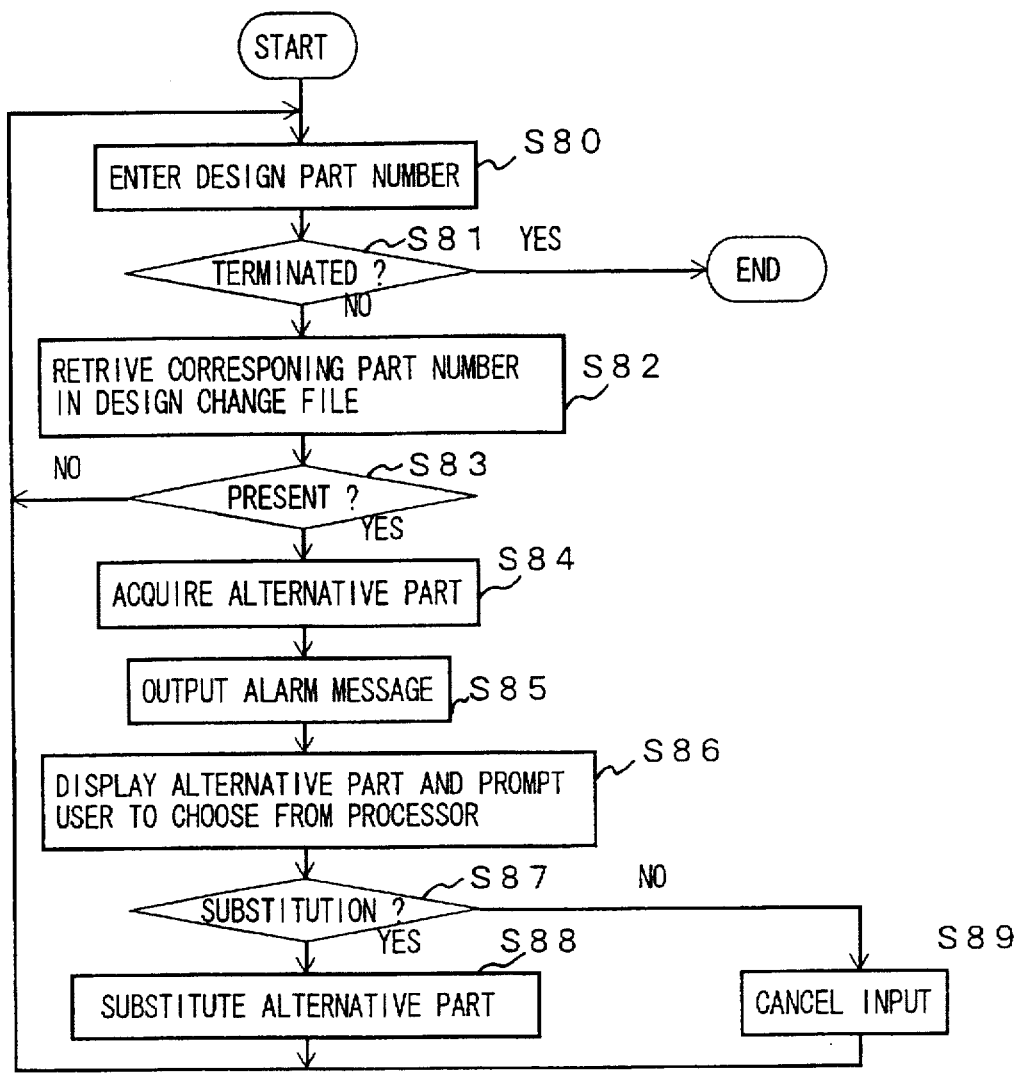
F I G. 20

PROCESSING DEVICE AND METHOD FOR MAKING ARRANGEMENTS FOR PARTS USED IN PRODUCTS

BACKGROUND OF THE INVENTION

1. Field of the Invention

The present invention relates to a device for making arrangements for parts in the manufacturing industry and a method therefore and more specifically to a part arrangement processing device which facilitates the application of design changes made by the design section to manufacture of products by the manufacturing section by making data on parts of a product specified by the design section correspond with data for arrangements for the corresponding parts in the manufacturing section and a method therefore.

2. Description of the Related Art

In manufacturing products in the general manufacturing industry, the design section first designs a product and then the manufacturing section makes arrangements for necessary parts on the basis of the design prior to manufacture of the product.

FIG. 1 is a diagram for use in explanation of a conventional process of making arrangements for parts. In this figure, when the design section designs a new product, the process 1 is performed to enter a design parts list indicating necessary parts based on the design. The list is stored in the design parts list database 2. The list is also delivered to the manufacturing section and stored as the design parts list (work) 3. In the design section, design parts lists classify each part by function; thus, they are not necessarily compiled in a form suitable for manufacture in the manufacturing section.

Even with a part that is classified by its function in the design section, the manufacturing section may divide it into subparts, in which case, some of them may be sublet while others may be substituted by pool parts stored in the factory. To ensure further increased efficiency in the manufacturing section, list configuration recomposition is performed frequently such that a part placed in a particular position in a design parts list may be placed in a different position in a production parts list, to be described later. Conventionally the design parts configuration recomposition 4 is performed by man power 12 in the manufacturing section. The production parts list, which is thus created as a parts list for the production section, is stored in the production arrangement database 5 and then used for production.

In the case of design changes to a product already manufactured, the design change request 6 by the design section is stored in a database as design change information 7 and the design change communication slips 8 are created and then delivered to the manufacturing section. The manufacturing section refers to the factory information 9 about the current manufacturing conditions and manufacturing planning of that product (condition referencing process 10), etc., and then gives instructions by man power 12 as to when to reflect the design changes in that product and so on (manual design change maintenance 11). The resulting production parts list is stored in the production arrangement database 5 and then used in manufacturing.

Thus, in the conventional parts arrangement processing system, information in the design section, such as a design parts list, and information in the manufacture section, such as a production parts list, are basically independent of each other. The results of the recomposition of the design parts list and the design change maintenance processing performed in the manufacturing section are not fed back to the design section. In addition, the recomposition and the design change maintenance are judged and instructed by experienced engineers.

With the conventional parts arrangement processing system therefore, a problem arises in that, even if the design section desires to utilize additional information, such as the cost of parts after the recomposition, it may not utilize such information because of disagreement between part numbers in the design parts list in the design section and parts numbers in the production parts list subjected to recomposition by the manufacturing section. Another problem is that, when design changes are made, the design section cannot exactly direct the manufacturing section to apply the design changes to the product being manufactured because factory information in the manufacturing section is unknown. Moreover, the possibility exists that the design section may make a mistake of listing a part, the use of which is stopped in the design parts list, again, because the conditions of the manufacturing section are unknown. Furthermore, the manufacturing section has to depend on skilled personnel for recomposition of parts lists.

The present invention permits parts recomposition to be performed as automatically as possible according to predetermined rules, parts arrangement work to be simplified, and design work efficiency to be further increased by feeding information from the manufacturing section to the design section.

SUMMARY OF THE INVENTION

The present invention permits parts recomposition to be performed as automatically as possible according to predetermined rules, parts arrangement work to be simplified, and design work efficiency to be further increased by feeding information from the manufacturing section to the design section.

An object of the present invention, is to provide a data link processing device for establishing a correspondence between part numbers of parts in a production parts list and part numbers of parts in a design parts list, to simplify a process of making arrangements for parts which is conventionally performed by experienced personnel, and to allow standardization of a design change application determination process by use of application rules.

A further object of the present invention is to reduce design mistakes which might be made.

A still further object of the present invention is to allow for inexperienced personnel to perform the process of making arrangements for parts by storing design- and manufacture-related rules.

A feature of the present invention resides in a processing device for making arrangements for parts composing a product, comprising design parts list entry means for creating a design parts list indicating necessary parts in accordance with the results of design in a product design; production arrangement parts list entry means for creating a production parts list indicating parts for arrangements for production, in accordance with said design parts list, in a product manufacturing; design/production parts list storage means for storing said design parts list and said production parts list; recomposition processing means for recomposing a hierarchical relationship among said parts in said production parts list; and data link processing means for establishing a correspondence between the numbers of parts, in said production parts list, subjected to recomposition and the numbers of corresponding parts, in said design parts list, whereby exchange of part data, between said design section and said production section, is facilitated, even after the recomposition of parts has been performed.

BRIEF DESCRIPTION OF THE DRAWINGS

FIG. 7 shows an example of the contents of the incorporated version number database of FIG. 5;

FIG. 8 shows an example of recomposition rules in the recomposition rule database;

FIG. 9 shows an example of the contents of the recomposed part number correspondence database;

FIG. 10 shows examples of rereading rules in the rereading rule database;

FIG. 11 shows an example of the contents of the reread part number correspondence database;

FIG. 12 shows examples of application rules stored in the application rule database;

FIG. 13 shows an example of an EC-application determination parameter prompting display screen;

FIG. 14 is a diagram for use in explanation of a changed drawing table based on design change number specification;

FIG. 15 is a detailed flowchart for configuration recomposition processing;

FIG. 19 is a detailed flowchart for application rule judgment processing; and

FIG. 20 is a detailed operation flowchart for alarm output processing.

DETAILED DESCRIPTION OF THE PREFERRED EMBODIMENT

Figure 1:
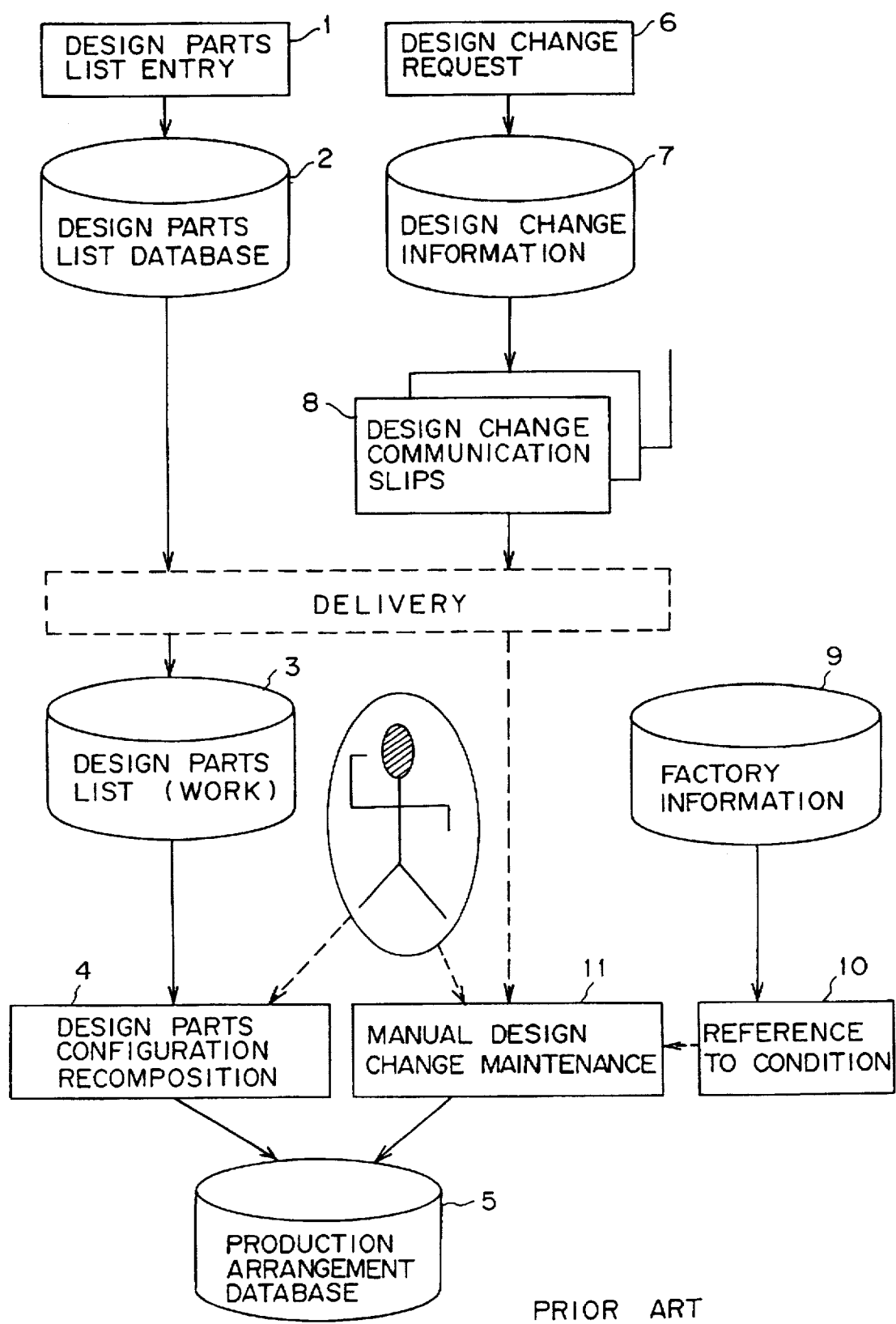
FIG. 1 is a diagram for use in explanation of a conventional parts arrangement processing system.
Figure 2:
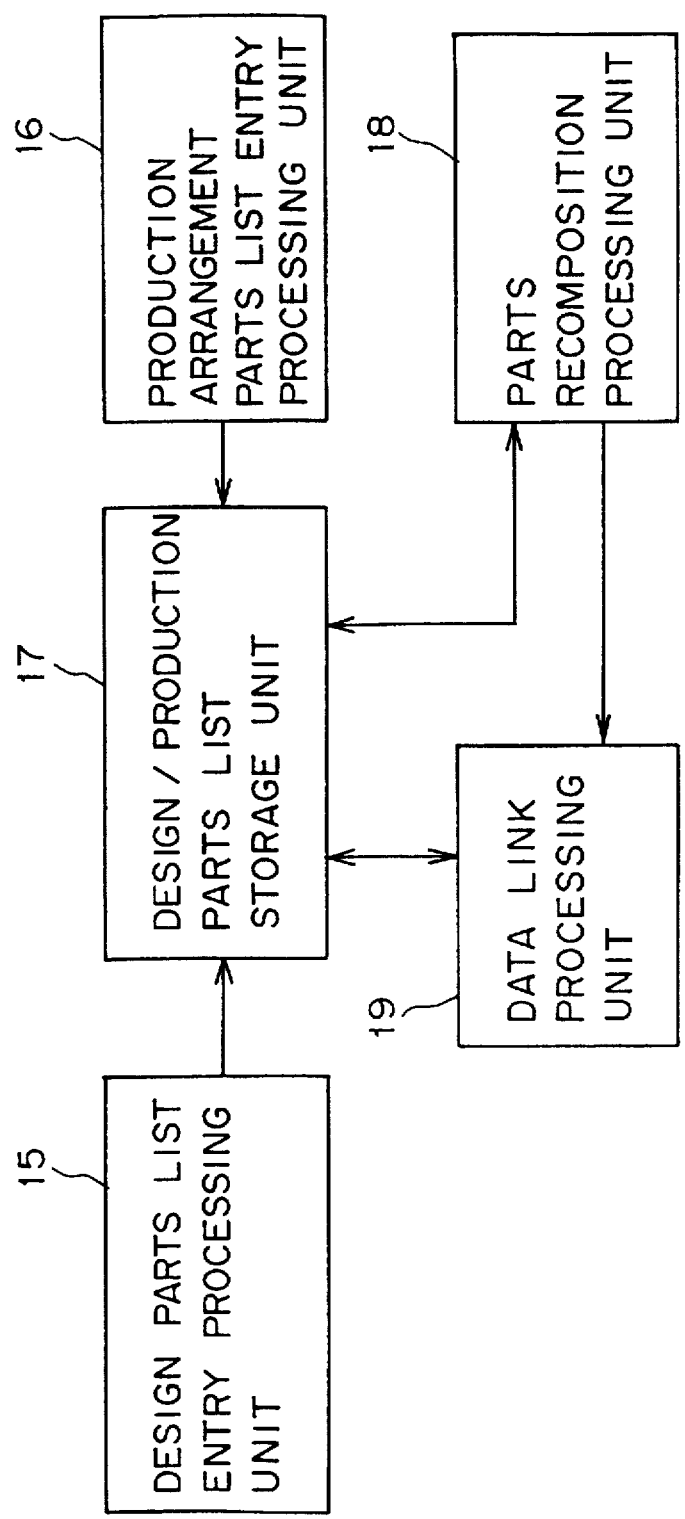
FIG. 2 is a basic block diagram of the present invention.

FIG. 2 is a block diagram illustrating the basic configuration of a parts arrangement system of the present invention which facilitates parts data interchange between the design section and the manufacturing section, even after recomposition of parts of which a product is composed.

In FIG. 2, the design parts list entry processing unit 15 creates a design parts list indicating necessary parts according to the results of design by the design section. The production arrangement parts list entry processing unit 16 creates a production (arrangement) parts list in the production section which indicates parts for arrangements for production in accordance with the design parts list. The design parts list and the production parts list are stored in the design/production part list storage unit 17.

The parts recomposition processing unit 18 recomposes the compositional relationship among parts in the production parts list in a different form from that in the design parts list.

The data link processing unit 19 makes the parts numbers, in the production parts list subjected to recomposition, correspond with the parts numbers in the design parts list.

In operation, a design parts list is first created by the design parts list entry processing unit 15 in the design section and then stored in the design/production parts list storage unit 17. In the production section, the design parts list is first copied unchanged onto a production arrangement parts list by the production arrangement parts list entry processing unit 16 and then the resulting production arrangement parts list is stored in the storage unit 17. When design changes are made, only changed portions are copied by the production arrangement parts list entry processing unit 16 into the storage unit 17 on the basis of the previous production parts list.

Figure 3:
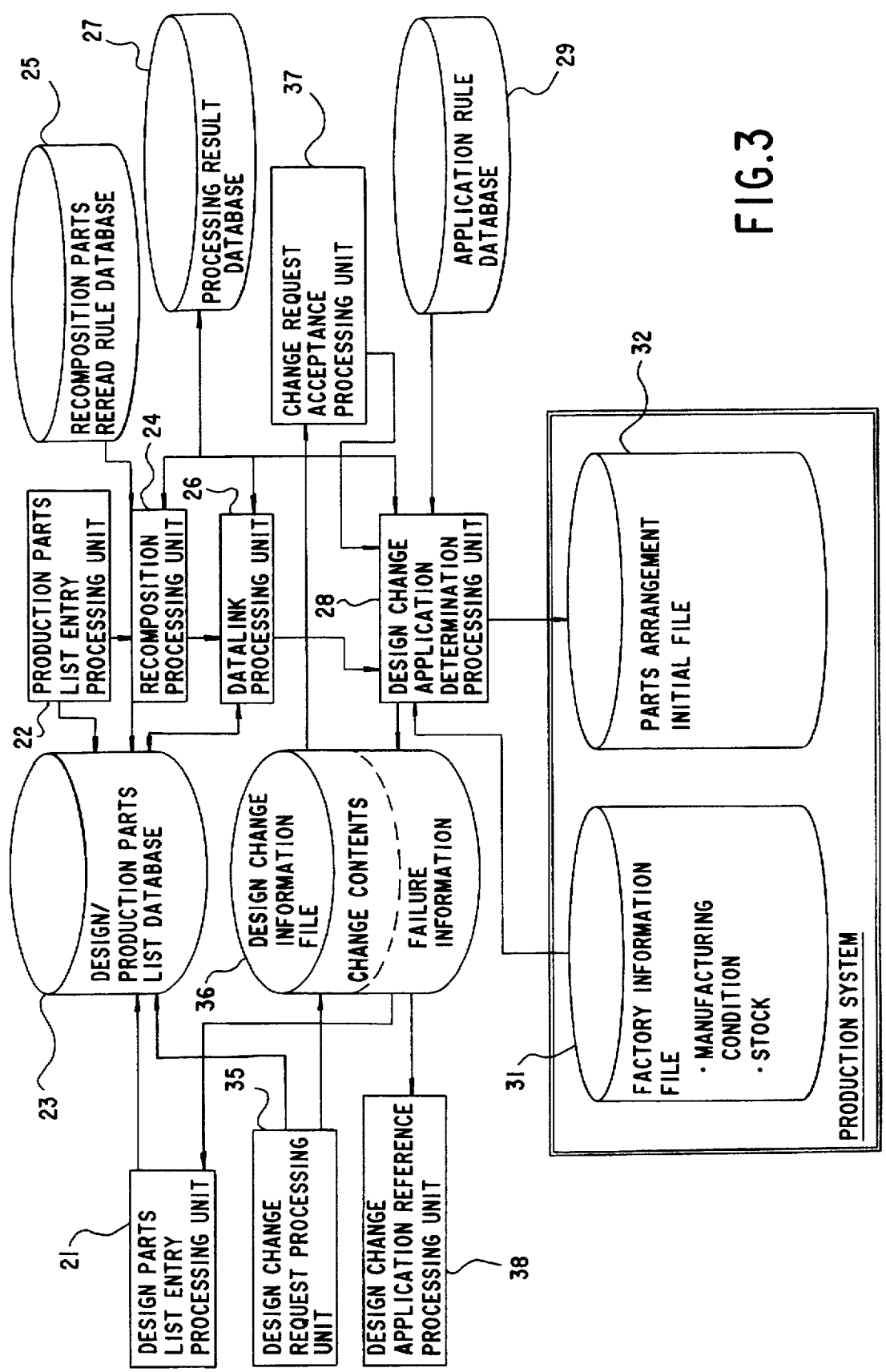
FIG. 3 is a total block diagram of a parts arrangement processing system embodying the present invention.

The parts recomposition processing unit 18, which performs recomposition of parts, uses the recomposition rules, maintained in the recomposition/part rereading rule database 25 of FIG. 3, for routine recomposition. This database 25 will be described later. Non-routine recomposition is performed by manual processing.

After that, the data link processing unit 19 performs such data link processing as establishing a correspondence between parts numbers in the production parts list subjected to parts recomposition and the parts numbers in the design parts list. The results of the processing are stored in a recomposed parts number correspondence database by way of example.

In this way, the present invention can improve efficiency in creating a production parts list for production arrangements and increase ease of feedback of data from the production section to the design section.

FIG. 3 shows, in block diagram form, the entire configuration of the parts arrangement processing system of the present invention. The design parts list entry processing unit 21 creates a design parts list indicating necessary parts in accordance with the results of design of a product. The production arrangement parts list entry processing unit 22 creates a production parts list, used for making arrangements for parts on the manufacturing side, in accordance with the design parts list. The two parts lists are stored in a design/production parts list database 23.

The recomposition processing unit 24 performs the recomposition of parts indicating a relationship among parts in the production parts list, by the use of rules maintained in the recomposition/part rereading rule database 25. The data link processing unit 26 establishes a correspondence between the parts numbers in the design parts list and the parts numbers in the production parts list, in accordance with the results of the recomposition by the recomposition processing unit 24. The results of the processing by the recomposition processing unit 24 and the data link processing unit 26 are stored in the processing result database 27.

The production parts list, obtained as a result of processing by the data link processing unit 26, is delivered to the design change application determination processing unit 28, which creates the parts arrangement initial file 32 in the production management system by referring to parts arrangement rules stored in the application rule database 29 as needed and to the factory information file 31 which stores data on manufacturing conditions and stock in the factory. Here, the "initial" file is so named because data about parts suppliers, the numbers of parts, and process codes, etc., are later attached to it for use.

At design change time, the design change request processing unit 35 on the design section side, stores the contents of changes in the design change information file 36, which are then sent to the change request acceptance processing unit 37 on the manufacturing side. The unit 37 sends the request to the design change application determination processing unit 28, which refers to the application rule database 29 and the factory information file 31 to determine when the design changes are to be applied to the product in the manufacturing section and the parts arrangement initial file 32 is created according to the determination.

The results of the determination by the design change application determination processing unit 28, (i.e., information about the time of application of design changes), are stored in the design change information file 36, which can be referred to by the design change application reference processing unit 38 in the design section. Note that, in FIG. 3, the design parts list entry processing unit 21, the design change request processing unit 35 and the design change application reference processing unit 38 are associated with the design section; the design/production parts list database 23 and the design change information file 36 are shared between the design section and the manufacturing section; the other blocks (22, 24 to 29, 31, 32 and 37) are associated with the manufacturing section.

Next, the operation of the parts arrangement processing system of the present invention will be described.

Figure 4A:
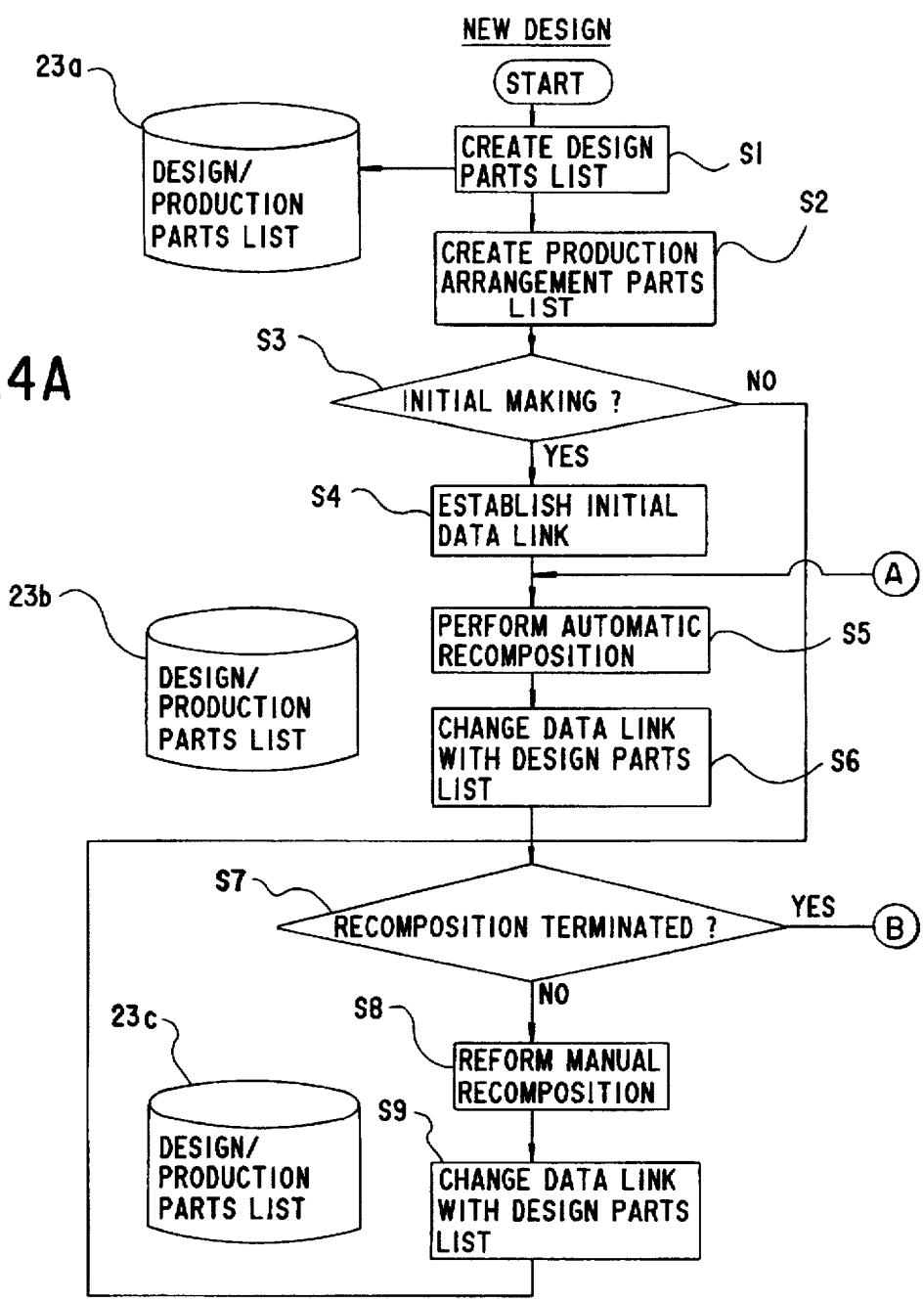
FIG. 4 is a total processing flowchart in the parts arrangement processing system of FIG. 3.
Figure 4:
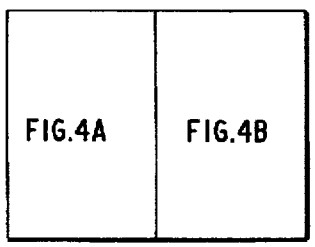

FIG. 4 is a flowchart of the overall operation of the parts arrangement processing of the present invention. At the time of design of a new product, a design parts list is first created in step S1, which is stored as the design/production parts list 23a in the design/production parts list database 23 of FIG. 3. Then, an instruction to create a production arrangement parts list is issued in step S2. In subsequent step S3, a decision is made as to whether or not that instruction is for initial making, that is, the instruction is for a new design parts list. In the case of initial making, i.e. initial data link, a production parts list is created by copying the design parts list, and data used to establish a correspondence between the parts numbers in the design parts list and the corresponding parts numbers in the production parts list are created in step S4, which are stored in the design/production parts list database 23 of FIG. 3. Note here that steps S1 and S2 are performed by the design parts list entry processing unit 21 of FIG. 3 and steps S3 and S4 are performed by the production arrangement parts list entry processing unit 22.

In subsequent step S5, automatic recomposition is performed by the recomposition processing unit 24 of FIG. 3, using the contents of the recomposition/part rereading rule database 25 to create a design/production parts list 23b, which is stored in the processing result database 27 of FIG. 3.

In step S6, changes are made to the data link, according to the results of the automatic recomposition, by the data link processing unit 26. In step S7, a decision is made as to whether or not the recomposition is terminated.

If the recomposition is not terminated, then manual recomposition will be needed. In step S8, therefore, such recomposition is performed and the results are reflected in the design/production parts list 23c. The results of the manual recomposition are reflected in the data link in step S9 and then the procedure returns to step S7.

At the time of design change (revised design), the design change request processing unit 35 of FIG. 3 makes a revision of the design parts list stored in the design/production parts list database 23 in step S11 and a request for design change is stored in the design change information file 36a in step S12. The request is accepted by the change request acceptance processing unit 37 in step S13 and an instruction to revise the production parts list is issued in step S14.

In response to the revised instruction by the design change request processing unit 35, the recomposition process and the data link change process are performed in steps S5 to S9.

If, regardless of new design or design change, the decision in step S7 is that the recomposition is terminated, then a decision is made in step S15 as to whether a change process is required or not. If the change process is required, then the design change application determination processing unit 28 performs the design change application determination process in step S16 by referring to the application rule database 29 and the factory information file 31. In step S17, the contents of change are stored in the design change information file 36 to meet the change requirement.

If the process in step S17 is terminated or if the decision in step S15 is that no change is required, then a parts arrangement file is generated automatically in step S18 and then stored as the parts arrangement initial file 32 in step S18. Thus, the procedure comes to an end.

Figure 5:
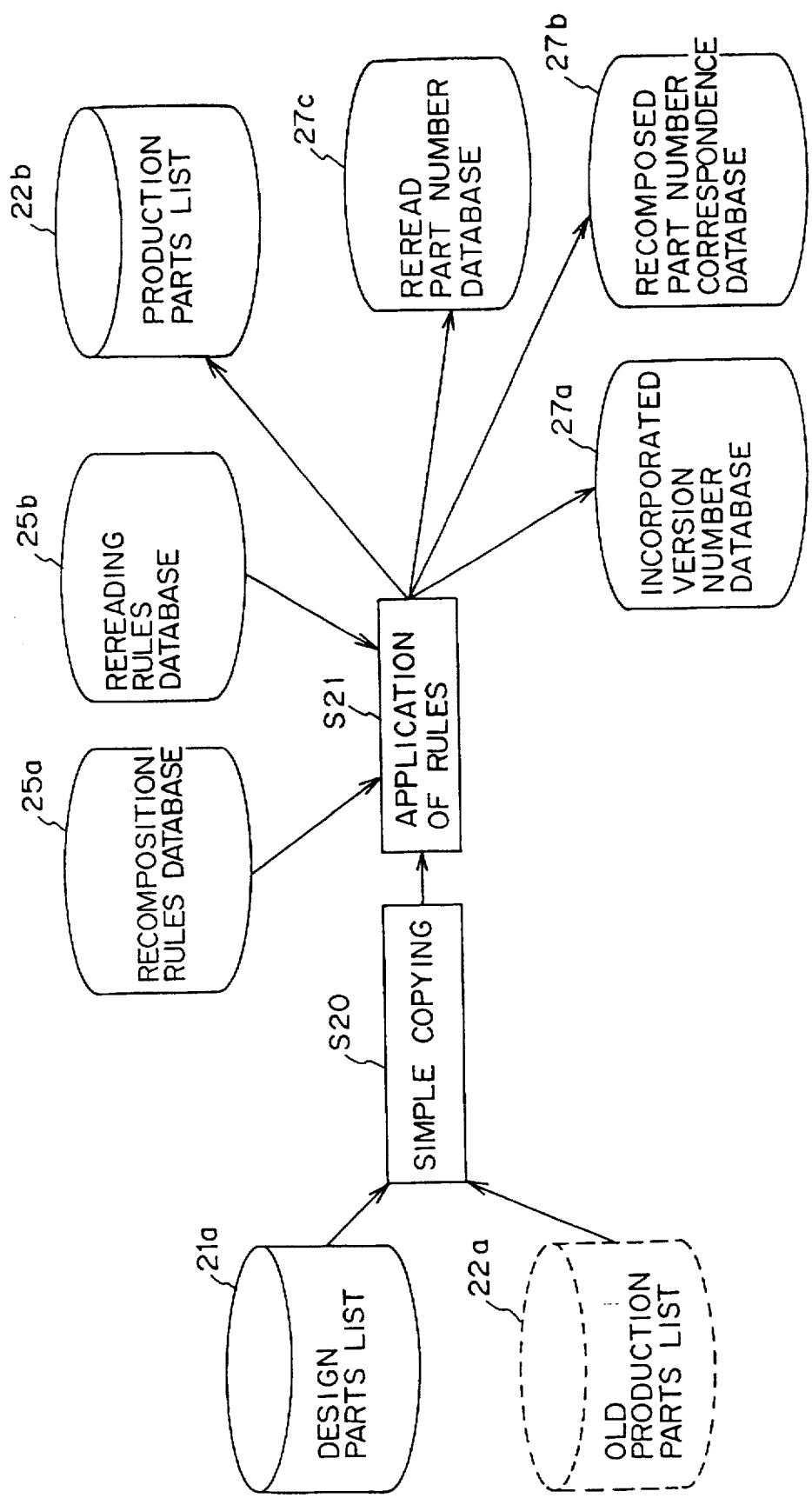
FIG. 5 is a diagram for use in explanation of a process of creating a production parts list.

FIG. 5 is a diagram for use in explanation of creation of a production parts list. In the case of new design, the design parts list 21a is copied unchanged into a production parts list in step S20 by the production arrangement parts list entry processing unit 22 of FIG. 3, which is stored in the design/production parts list database 23. In the case of design change, only changed portions of the design parts list 21a are copied on the basis of an old production parts list 22a and then stored in the design/production parts list database 23 by the production arrangement parts list entry processing unit 22.

In subsequent step S21, a recomposition process, using the rules in the recomposition/parts rereading rule database 25, is performed by the recomposition processing unit 24 of FIG. 3. The recomposition process includes a process using the recomposition rules database 25a for changing the compositional relationship between parts in design and production parts lists and a process using the rereading rules database 25b for simply rereading parts numbers.

The production parts list 22b is created based on the results of the recomposition. At the same time, the incorporated version number database 27a indicating which version of the design parts list is incorporated to create the production parts list 22b, the recomposed part number correspondence database 27b as a result of the recomposition process by the recomposition rules, and reread part number database 27c as a result of the process of simply rereading part number, are stored in the processing result database 27 of FIG. 3.

Figure 6:
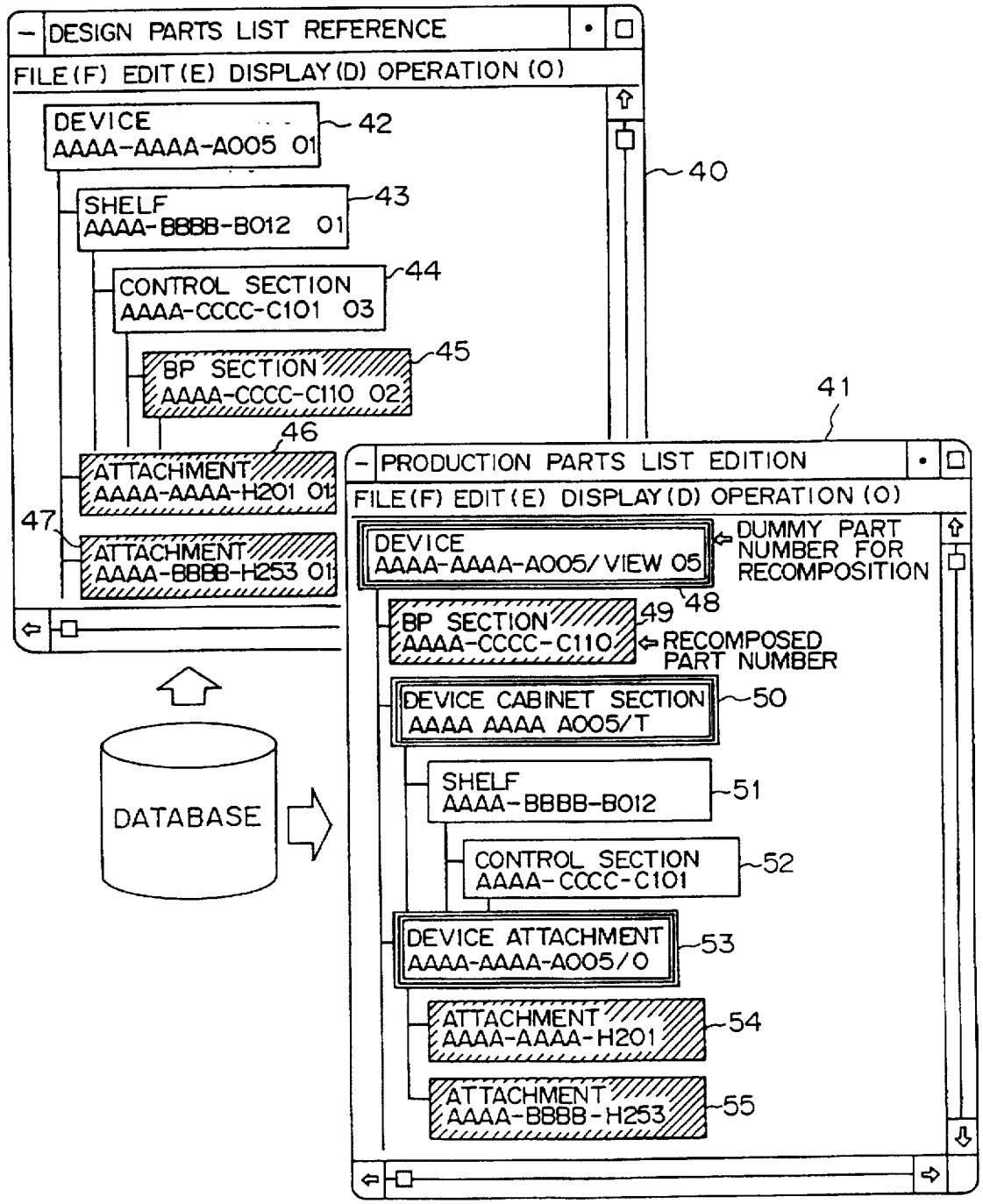
FIG. 6 shows a design parts list and a production parts list.

FIG. 6 shows an example of the design parts list 40 and an example of the production parts list 41 resulting from the recomposition process performed on that design parts list. In the production parts list 41, the recomposition process is performed such that the BP (back panel) section 45 which, in the design parts list 40, is placed under the control section 44, is placed immediately under the device 48 at the highest level, the shelf 51 and the control section 52 are grouped under the device cabinet section 50, and two attachments 54 and 55 are grouped under the device attachment 53.

Here, to distinguish the production parts list from the design parts list, a symbol "/VIEW" is added to the end of the part number for the device 48. Moreover, a symbol "/T" is added to the end of the part number for the device cabinet section 50 to indicate a group in which the BP section 45 is excluded from parts arranged under the shelf 43 in the design parts list. Furthermore, a symbol "/O" is added to the end of the part number of the device attachment 53 to indicate that the attachments 54 and 55 are grouped together.

In FIG. 6, shaded portions indicate parts subjected to recomposition in the production parts list, and double-line blocks indicate blocks which are created anew for recomposition on the production parts list side. In the example of FIG. 6 the device 42 in the design parts list 40 is made to correspond with the device 48 in the production parts list 41 which is composed of the device cabinet section 50, the device attachment 53 and the BP section 49. The parts numbers in these parts lists will be described later in detail.

FIG. 7 shows exemplary stored contents of the incorporated version number database 27a of FIG. 5, the correspondence of which, with the design parts list 40 and the production parts list 41 of FIG. 6, will be described. The first line in the table of FIG. 7 corresponds to the device 48 at the highest level in the production parts list 41 of FIG. 6 and contains the part number, the incorporated version number, and the date of design. Each level number indicates the depth of a hierarchy in the parts list. The level 0 indicates a part at the highest level in the hierarchy.

The lines below the first line correspond to the contents of the design parts list 40 of FIG. 6. The second line indicates that the part number, the incorporated version number and the date of design of the device 42, as a part in the highest position in the hierarchy in the design parts list, are AAAA-AAAA-A005, 1, and Jan. 7, 1993, respectively. The third line indicates that the part number, the incorporated version number, and the date of design of the shelf 43, as a part at the level 1 in the design parts list, i.e., a part hierarchically immediately below the device 42, are AAAA-BBBB-B012, 1, and Jan. 7, 1993, respectively.

FIG. 8 shows exemplary recomposition rules stored in the recomposition rules database 25a of FIG. 5. The rules will be explained with reference to FIG. 6. The first line indicates a recomposition rule for parts whose name is "attachment". In this example, such parts are specified to be merged, or collected. For recomposition position, the parts are specified to be rearranged immediately below the product, the device 42 in FIG. 6, which is at the highest level in the hierarchy of parts. For rearrangement part number, a part which is in a form in which all attachments are collected and which has a part number having "/0" added to the end of the part number of that product, is specified to be set up anew. Correspondingly, two attachments 46 and 47 in the design parts list 40 are collected in the production parts list 41 as the attachments 54 and 55 below the device attachment 53. The device attachment 53 is positioned as a part hierarchically immediately below the device 48.

The processing for the BP section 45 on the second line in FIG. 8 is "up", which means a shift to a higher level in the hierarchy. For the position for recomposition, the BP section is specified to be positioned immediately below the product which is at the highest level in the hierarchy. Correspondingly, the BP section 45 which, in the design parts list 40, is placed below the control section 44, is placed immediately below the device 48 at the highest level in the hierarchy, in the production parts list 41.

FIG. 9 shows the correspondence between recomposed part numbers after the recomposition is performed in accordance with the rules for recomposition, i.e., the stored contents of the recomposed part number correspondence database 27b of FIG. 5. This example indicates the correspondence between part numbers resulting from the recomposition following the two rules shown in FIG. 8.

The first two lines, numbered 1, correspond to the devices 42, 48 in FIG. 6, which shows that the part numbers of the devices 42 and 48 at the highest level have been changed as a result of the recomposition based on the two rules for recomposition shown in FIG. 8. "OLD" indicates the part number in the design parts list 40 and "NEW" indicates the part number in the production parts list 41.

The third through seventh lines, numbered 2, indicate the correspondence between part numbers resulting from the recomposition following the rule, the code of which is 0001 on the first line of FIG. 8. The third and fourth lines indicate the relationship between parent and child part numbers in the design parts list 40. More specifically, the third and fourth lines indicate that the two attachments 46 and 47 are defined by child part numbers of the device 42 at the highest level. The fifth, sixth and seventh lines indicate that the two attachments 54 and 55 and the device attachment 53 under which these attachments are collected, in the production parts list 41, are defined by child part numbers of the device 48 at the highest level. The eighth and ninth lines, numbered 3, indicate the correspondence between part numbers resulting from the recomposition of the BP section following the rule, the code of which is 0002 on the second line of FIG. 8.

Thus, according to the recomposition processing of the present invention, a production parts list, as shown in FIG. 6, is automatically generated from a design parts list in accordance with such recomposition rules, as shown in FIG. 8, which are stored in the recomposed-parts rereading rule database of FIG. 3, and such part numbers having recomposition correspondence, as shown in FIG. 9, are stored in the processing result database 27.

FIG. 10 shows exemplary rereading rules stored in the rereading rules database 25b of FIG. 5. As described previously, the rereading rules are used to simply reread part numbers in the design parts list 40 and part numbers in the production parts list 41. The rule on the first line indicates that a part number in the production parts list 41 that corresponds to a part number in the design parts list 40, (i.e., a part number for arrangements), does not exist. The part whose part number starts with F6 is, for example, a secondary material, such as a screw, which is usually stocked in the factory all the time. Thus, the manufacturing section need not make special arrangements for such parts and therefore no arrangement part number exists.

The second line indicates the rereading rule for a taping material such as a resistor. The rereading rule specifies, for the arrangement part number, that T is to be added to the end of the design part number.

FIG. 11 shows exemplary reread part numbers which are made to correspond to each other in accordance with the rereading rules of FIG. 10. For example, the first line indicates that a child part number whose parent part number corresponds to the device 42 of FIG. 6, is CAA-12345-678J on the design section side, but an arrangement part number, that is, a new child part number has T added to the end of the old child part number.

Thus, according to the reread processing of the present invention, rereading is performed automatically in accordance with such rereading rules, as shown in FIG. 10, stored in the recomposition/part rereading rule database 25 of FIG. 3. Such reread-correspondence parts numbers, as shown in FIG. 11, are stored in the processing result database 27 of FIG. 3.

FIG. 12 shows exemplary application rules stored in the application rule database 29 of FIG. 3. The rule on the first line, represented by code 0001, indicates a rule for the presence or absence of a change in an arrangement part corresponding to the design parts list. In the event of a change, the rule represented by code 0002 for OK is applied. In the absence of a change, that is, in the case of NG, the 0101 rule (not shown) is applied, so that additional sheeting is performed by way of example.

With the code 0002 rule, the time of arrangement in the manufacturing plan is decided. If arrangement has not yet been made, the code 0003 rule will be executed. If, on the other hand, arrangement has already been made, then the code 0004 rule will be executed.

With the code 0003 rule, when no arrangements for parts have been made in the code 0002 rule, design changes are made to the old production parts list to create a new production parts list. The code in the OK field for this rule is 0000, which indicates no further rule application is performed.

With the code 0004 rule, when arrangements for a part have been made in the code 0002 rule, the product of the number of products to be manufactured and the number of parts that required for one product, is subtracted from the total stock of that part and a decision is made as to whether the difference is positive or not. When the difference is positive, the parts in stock will be sufficient. In this case, arrangement for delivery of parts from the warehouse is made by the code 0005 rule. When the difference is negative, additional arrangements for parts are required, which is performed by the code 0006 rule.

FIG. 13 shows an example of an EC (engineering change, design change) application determination parameter prompting display screen. Parameters which need to be specified by the design section are specified by the design change request processing unit 35 of FIG. 3, while parts which need to be specified by the manufacturing section are specified by the design change application determination processing unit 28.

EC factors indicate factors of design change and include failure factors, customers' requirement factors, functional factors, cost factors, etc. For application conditions, if the EC factor is cost down, the application of next lot/next term arrangements for parts is selected because the cost down is allowed from the next lot. The contents of change indicate main changes in the PT plate, device and mechanism. The classification indicates which portion is to be changed. The failure scale is an estimate of loss to cope with a failure and is indicated by an amount of money for a loss in the factory. The conditions indicate, of 1,000 products to be manufactured according to a plan, the number of shipped products is 100, the number of unarranged products is 900, and the total number of products which are being tested, manufactured and have been arranged, is 100.

With the parts arrangement processing system of the present invention, when design changes are made because of changes of specifications and failures, the contents of changes are reflected in the production parts list in the design/production parts list database 23 from the design change request processing unit 35 of FIG. 3, and data used to identify changed drawings are stored in the design change information file 36.

FIG. 14 is a diagram for use in explanation of a process of retrieving changed drawings using the contents of the design change information file 36. In changing design, usually more than one drawing is changed. The present embodiment describes the same design change number on two or more drawings to be changed and allows the changed drawing numbers to be retrieved by that number.

In FIG. 14, when EC0567-A005 is specified as a design change number, drawings with that number are retrieved from design data and desired information is extracted in the form of a list of changed drawings.

The characteristic processes of the present invention in the flowchart of FIG. 4 will be described hereinafter, with reference to FIGS. 15 to 20.

FIG. 15 is a detailed flowchart for the automatic recomposition process in step S5 in FIG. 4. First, in step S30, the rules for recomposition are read from the recomposition/part rereading rule database 25 of FIG. 3 by line and then a decision is made in step S31 as to whether or not the reading of all the recomposition rules is terminated. If not terminated, recomposition conditions are set in an inquiry character string in step S32. That is, a character string is set which is used to make an inquiry about, (i.e. a search for) a part in the design parts list on the basis of the items in the condition field, shown in FIG. 8. In the example of code 0001 of FIG. 8, a search is made for a part, the name of which is "attachment".

In step S33, a search is made of the design parts list for part data matched with the inquiry character string. In step S34, a decision is made as to whether those data are present or absent. In the absence of such data, the procedure returns to step S30.

In the presence of such data, a decision is made in step S35 as to whether or not a match is found for the first time in the recomposition processing. If so, it is necessary to establish a correspondence between the parent part number at the highest level in the design parts list and the parent part number in a parts list created as a result of the recomposition. Thus, in step S36, the parent part number at the highest level in the design parts list is saved. The saving of the parent part number means that the first line is written with in FIG. 9. In subsequent step S37, the recomposed parent number at the highest level in the production parts list is saved, that is, the second line in FIG. 9 is written with and then the procedure goes to step S38. If NO in step S35, then the procedure will go to step S38, without performing steps S36 and S37, because the correspondence between the part numbers at the highest level should have already been established.

In step S38, a parent number in the recomposition position is acquired. That is, a parent part number is acquired on the basis of the recomposition position, indicated by the recomposition rules of FIG. 8. In the example of FIG. 8, the recomposition position is indicated by PRODUCT, which corresponds to the parent part number at the highest level. Thus, the parent part number on the second line in FIG. 9 is acquired. In subsequent step S39, a decision is made as to whether or not the recomposition processing is MERGE. If YES, a recomposed part number is generated in step S40. Here, the recomposition number "/O" on the first line of FIG. 8 is added to the end of the part number "AAAA-AAAA-A005" of the device 42 in the design parts list 40 of FIG. 6, to generate a recomposed part number "AAAA-AAAA-A005/O" of the device attachment 53 in the production parts list 41. If not MERGE in step S39, step S40 is not carried out.

Next, in step S41, part numbers prior to recomposition are saved. That is, the parent and child part numbers in the design parts list are written in as indicated by the third, fourth and eighth lines in FIG. 9. In step S42, a decision is made as to whether or not a recomposed parent number has already been defined. If not already defined, then a recomposed parent number is saved in step S43, that is, the fifth line of FIG. 9 is written with and recomposed child part numbers are saved in step S44, that is, the sixth, seventh and ninth lines of FIG. 9 are written with. After that, the procedure returns to step S30.

If, on the other hand, the decision in step S42 is that the recomposed parent part number has already been defined, then the procedure will go to step S30 after the execution of step S44, without carrying out step S43. Finally, at the time when it is decided in step S31 that all the recomposition rules have been read, then the automatic recomposition processing is brought to an end.

Figure 16:
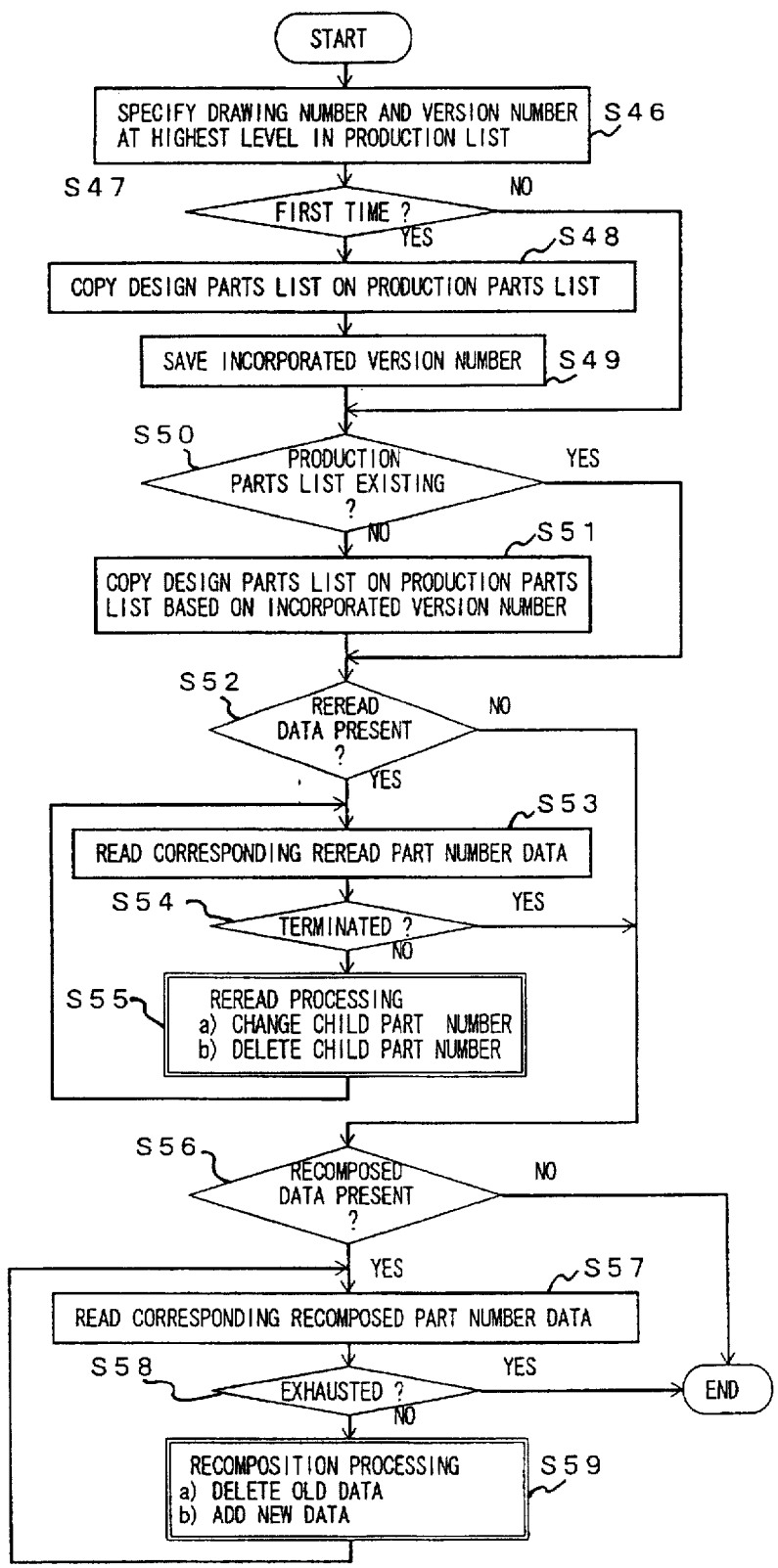
FIG. 16 is a detailed flowchart for data link processing.

FIG. 16 is a flowchart for the data link processing in step S6 or step S9 of FIG. 4. First, a production parts list is created in steps S46 through S51 by the production arrangement parts list entry unit of FIG. 3. In step S46, a drawing number and a version number, which are at the highest level, are specified. These numbers are specified by the user or selected from among existing production parts lists. In step S47, a decision is made as to whether or not the production parts list is created for the first time.

If YES, then the design parts list is simply copied onto a production parts list. In subsequent step S46, the version number to be incorporated is saved, which is performed on the basis of the design parts list. A part list version number is saved for each level in the design parts list of FIG., 6. If the decision in step S47 is that it is not a new production parts list that is created, the procedure will immediately go to step S50, without carrying out steps S48 and S49. In step S49, the latest version number of the design parts list is incorporated as the default version number, but it is also possible to incorporate a lower version number.

In step S50, a decision is made as to whether or not a production parts list exists. If NO, the design parts list is copied onto a production parts list on the basis of the incorporated version number in step S51 and then the procedure goes to step S52.

If YES in step S50, then the procedure immediately goes to step S52. In this case, an existing production parts list is used on the basis of the incorporated version number.

In step S52, a decision is made as to whether or not data that have been reread according to the rereading rules are present. If YES, the corresponding part number data are read and then a decision is made in step S54 as to whether or not reread data are exhausted. If NO, the rereading process is performed in step S55. In this process, a child part number is changed or deleted. In the example of FIG. 11, on the first line, a child part number is changed and, on the second line, a child part number is deleted. After that, the procedure returns to step S53.

If NO in step S52 or if YES in step S54, the procedure goes to step S56. For the manual rereading process, only step S55 is performed, which corresponds to step S9 in FIG. 4.

In step S56, a decision is made as to whether or not data, recomposed according to the recomposition rules, are present. If YES, the corresponding recomposed part number data are read in step S57. Since the results of the recomposition process have already been saved in a file, corresponding changes are made to the production parts list. In subsequent step S58, a decision is made as to whether or not the recomposition data are exhausted. If NO, the recomposition process is performed in step S59, that is, old data are deleted and new data are added. The procedure then returns to step S57. If NO in step S56 or YES in step S58, on the other hand, the data link processing comes to an end. For the manual recomposition process, only step S59 is performed, which also corresponds to step S9 in FIG. 4.

Figures 17A, 17B:
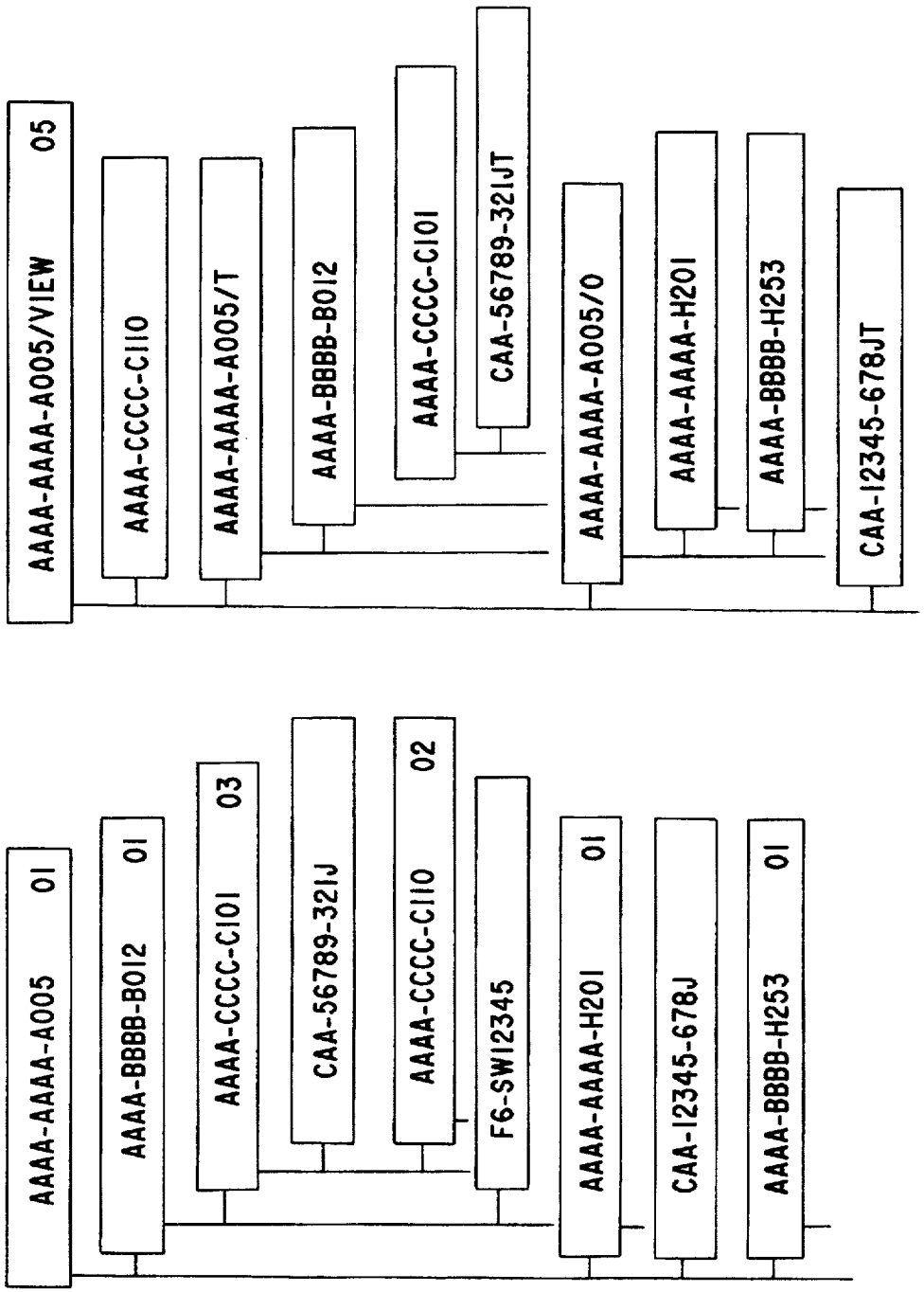
FIGS. 17a and 17b show the results of execution of the rereading process and the recomposition process in FIG. 16.

FIG. 17 shows specific examples of the results of the rereading process in step S55 and the recomposition process in step S59 in FIG. 16. Like FIG. 6, FIG. 17 shows the contents of the design and production parts lists. In the design parts list, shown at (a) in FIG. 17, a part named "F6-SW12345" is indicated, which, as described in connection with the rereading rules in FIG. 10, is a pool part and hence deleted from the production parts list, shown at (b) in FIG. 17. The part number of two parts in the design parts list, which starts with CAA and ends with J, is reread to a part number having T added to its end in the production parts list.

Figure 18:
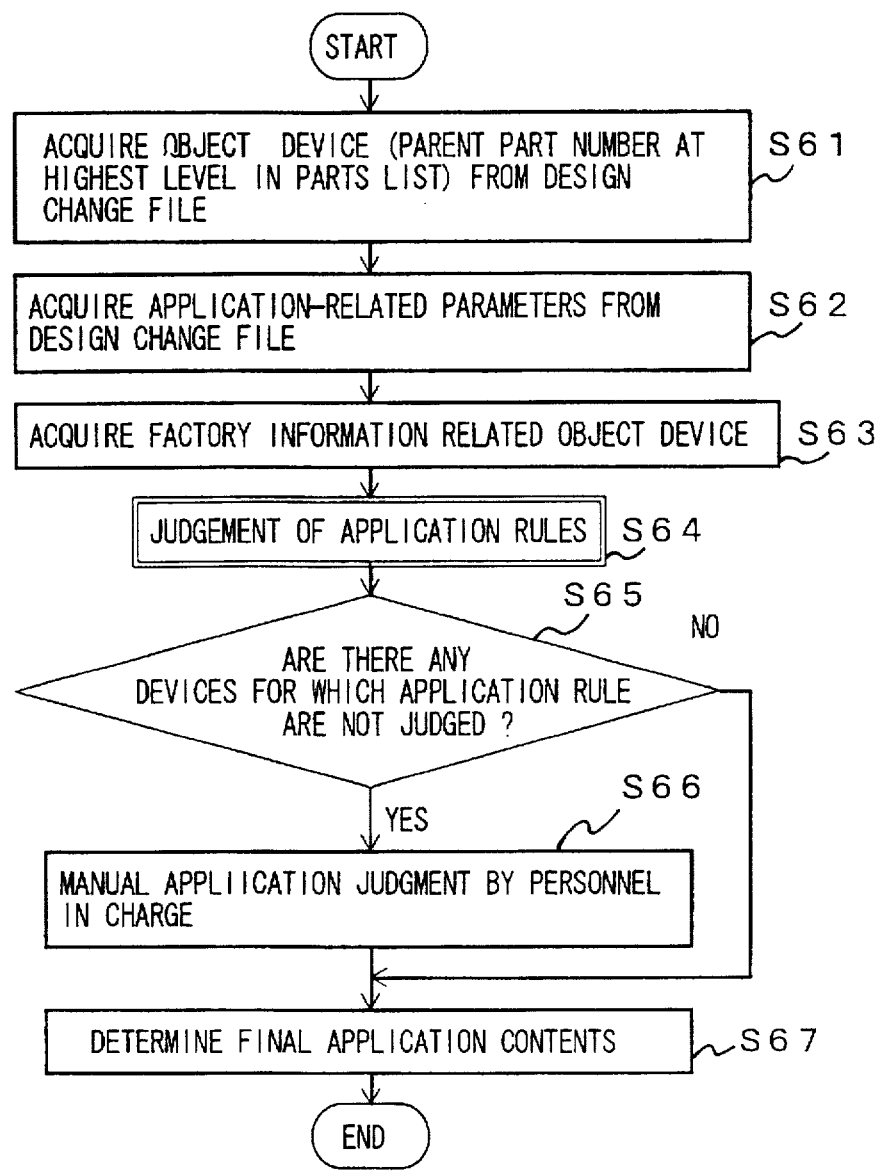
FIG. 18 is a detailed flowchart for design change application determination processing.

FIG. 18 is a detailed flowchart for the design change application determination process in step S16 of FIG. 4. In step S61, information about devices (the parent part numbers at the highest level in the parts list), which are candidates for the design change application determination process, is retrieved from the design change information file 36 of FIG. 3. That is, since the design changes in two or more devices are indicated by the design section, their information is retrieved.

In subsequent step S62, application-related parameters, such as application conditions, changing work contents, etc., are retrieved from the design change information file 36. These parameters are specified by the design section according to the degree of design changes through the EL application determination parameter prompting display screen, shown in FIG. 13. In step S63, the number of devices to be manufactured is examined in the factory information file 31 of FIG. 3, as factory information related to devices subjected to design changes. The information is then used to judge the application rules stored in the application rule database 29 in step S64. This process will be described with reference to FIG. 19.

In step S65, a decision is made as to whether or not there are any of the devices for which the application rules are not judged. If YES, the application rules, stored in the application rule database 29 of FIG. 3, cannot be used to determine the application of design changes to such devices. In step S66, therefore, the personnel in charge judge the application rules. After that, the procedure goes to step S67. If, on the other hand, there are no devices for which the application rules are not judged, the procedure immediately goes to step S67, in which the final contents of design changes, such as the number of parts to be delivered from the warehouse, the number of parts to be arranged, changing processes, etc., are determined according to the results of the rule application or the results of judgment by the personnel in charge. Thereby, the design change application determination process is terminated, so that changing work based on the determined contents is started.

FIG. 19 is a detailed flowchart for the application rule judgment process in step S64 of FIG. 18. In step S70, the application rules are read line by line from the application rule database 29 of FIG. 3. Note that, since, as described in connection with FIG. 12, a code to be judged next is specified according to the rule judgment results, this reading operation is not necessarily performed sequentially but according to the next code, i.e., the next reading number. In step S71, a decision is made as to whether or not a part that has a part number to which the rules are applied exists in the design change information file 36. If such a part exists, then the contents are verified on the basis of the rules in step S72. That is, on the basis of the contents of the rule field of FIG. 12, a judgment based on corresponding information is performed. Whether OK or not is decided in step S73. If YES, the procedure goes to step S74 in which the next record number, i.e. the rule code, is set. If NO, then the next record number or rule code, is set in step S75. In subsequent step S76, a decision is made as to whether or not the code is 0000. If NO, the procedure returns to step S70. If YES in step S71 or if YES in step S76, then the application rule judgment process terminates.

With the parts arrangement processing system of the present invention, the part numbers of failing parts are stored as failure information in the design change information file 36 and an alarm is output when a design parts list using such failing parts is created or changed, thereby preventing failing-parts-based design.

FIG. 20 is a flowchart for the alarm output processing. In step S80, design part numbers needed on the design side are entered. A decision is made in step S81 as to whether or not the part number entry is terminated, that is, whether or not design part numbers are exhausted. If NO, a corresponding part number is retrieved in the design change information file in step S82 and then a decision is made, in step S83, as to whether or not the corresponding part number exists. If NO, the procedure returns to step S80.

If YES in step S83, the number of an alternative part to be substituted for the corresponding part which may be, for example, a failing part, is acquired in step S84 and then an alarm message is output in step S85. Following the alarm message, the alternative part is displayed in step S86, whereby the user is prompted to choose from processes.

In step S87, a decision is made as to whether or not substitution is chosen by the user. If YES, the substitution of the alternative part is performed. If NO, the entered design part number is canceled, so that it is not entered into the design parts list. The procedure then returns to step S80. When it is decided, in step S81, that design part numbers are exhausted, the alarm output process is terminated.

What is claimed is:

1. A processing device for making arrangements for parts composing a product, comprising:

design parts list entry means for creating a design parts list indicating necessary parts in accordance with the results of design in product design;

production arrangement parts list entry means for creating a production parts list indicating parts for arrangements for production, in accordance with said design parts list, in product manufacturing;

design/production parts list storage means for storing said design parts list and said production parts list;

recomposition processing means for recomposing a hierarchical relationship among said parts in said production parts list, said hierarchical relationship corresponding to a process of said product manufacturing; and data link processing means for establishing a correspondence between the numbers of parts, in said production parts list, subjected to recomposition and the numbers of corresponding parts, in said design parts list, whereby exchange of part data, between a design section and a production section, is facilitated, even after the recomposition of parts has been performed.

2. The device according to claim 1, further comprising recomposition rule storage means for storing rules for recomposition of said parts in said production parts list, and wherein said recomposition processing means performs automatic recomposition, using said rules.

3. The device according to claim 2, wherein said rules include rereading rules indicating part numbers of parts in said production parts list to which part numbers of corresponding parts, in said design parts list, are to be reread.

4. The device according to claim 1, further comprising a design change request processing means for reflecting design change request by said design section in the stored contents of said design/production parts list storage means.

5. The device according to claim 4, further comprising design change information storage means for storing data used to identify drawings changed according to said design change request.

6. The device according to claim 5, further comprising design change application determination processing means for, in said production section, determining application contents, including the application time of said design change, on the basis of data stored in said design change information storage means, by referring to manufacturing conditions and parts stock conditions in a factory.

7. The device according to claim 6, further comprising application rule storage means for storing application rules for determining the application contents of said design change, and wherein said design change application determination processing means determines the application contents automatically, using said application rules.

8. The device according to claim 5, wherein said design change information storage means further stores the results of application of said design change performed by said production section according to said design change request, and further comprising a design change application reference processing means for permitting said design section to make reference to the results of application of said design change.

9. The device according to claim 8, wherein, when said design change request is made for a failure, said design change information storage means further stores the contents of said request and the results of measures taken by said production section against said failure, to permit said design change application reference processing means to make a reference to the stored contents.

10. The device according to claim 9, further comprising means for outputting an alarm when the use of a failing part, stored in said design change information storage means, is specified in a process of creating a design parts list by said design parts list entry means.

11. A part arrangement processing device comprising:

first storage means for storing a first parts list indicating a hierarchical composition of parts;

recomposition means for recomposing the composition of said parts in said first parts list, to create a second parts list;

second storage means for storing said second parts list; and data link processing means for establishing a correspondence between the part numbers of parts in said first parts list and the part numbers of corresponding parts in said second parts list.

12. The device according to claim 11, wherein said recomposition means collects some of the parts in said first parts list and generates a part number for identifying the collection of parts.

13. The device according to claim 11, wherein said recomposition means shifts a part at a low hierarchical level, in said first parts list, to a higher level, to divide a collection of parts.

14. A part arrangement processing method comprising the step of establishing a correspondence between the numbers of parts in a design part list and the numbers of corresponding parts in a production parts list when said production parts list is generated by recomposing a hierarchical composition of parts in said design parts list.

15. A processing method for making arrangements for parts composing a product, comprising the steps of:

creating a design parts list indicating necessary parts in accordance with the results of design in a product design;

creating a production parts list indicating parts for arrangements for production, in accordance with said design parts list, in a product manufacturing;

storing said design parts list and said production parts list;

recomposing a hierarchical relationship among said parts in said production parts list; and establishing a correspondence between the numbers of parts, in said production parts list, subjected to recomposition and the numbers of corresponding parts, in said design parts list, whereby exchange of part data, between said design section and said production section, is facilitated, even after the recomposition of parts has been performed.

* * * * *